United States Patent
Wu et al.

(10) Patent No.: US 7,525,768 B2
(45) Date of Patent: Apr. 28, 2009

(54) ELECTRICAL CONNECTION BETWEEN A SUSPENSION FLEXURE CABLE AND A HEAD STACK ASSEMBLY FLEXIBLE CIRCUIT

(75) Inventors: Li Xing Wu, Dongguan (CN); Yiu Sing Ho, Shatin, N.T. (HK); Jeffery L. Wang, Tai Po, N.T. (HK); Liu Jun Zhang, Dongguan (CN)

(73) Assignee: SAE Magnetics (H.K.) Ltd., Shatin, N.T. (HK)

( * ) Notice: Subject to any disclaimer, the term of this patent is extended or adjusted under 35 U.S.C. 154(b) by 0 days.

(21) Appl. No.: 11/525,608

(22) Filed: Sep. 21, 2006

(65) Prior Publication Data

US 2007/0014051 A1 Jan. 18, 2007

Related U.S. Application Data

(62) Division of application No. 10/754,203, filed on Jan. 9, 2004, now Pat. No. 7,411,763.

(30) Foreign Application Priority Data

May 12, 2003 (WO) ..................... PCT/CN03/00341

(51) Int. Cl.
G11B 5/55 (2006.01)
G11B 21/08 (2006.01)
G11B 21/02 (2006.01)

(52) U.S. Cl. .................................. 360/264.2
(58) Field of Classification Search ............... 360/264.2
See application file for complete search history.

(56) References Cited

U.S. PATENT DOCUMENTS

| | | | | |
|---|---|---|---|---|
| 4,642,670 A * | 2/1987 | Striny | .......................... | 257/696 |
| 4,673,967 A * | 6/1987 | Hingorany | .................. | 257/696 |
| 4,970,365 A | 11/1990 | Chalco | .................. | 219/121.63 |
| 5,033,970 A * | 7/1991 | Buchoff | ........................ | 439/66 |
| 5,095,396 A | 3/1992 | Putnam et al. | .............. | 360/106 |
| 5,298,715 A | 3/1994 | Chalco et al. | .......... | 219/121.64 |
| 5,337,202 A | 8/1994 | Jabbarai et al. | .......... | 360/97.01 |
| 5,530,604 A | 6/1996 | Pattanaik | ..................... | 360/104 |
| 5,668,684 A | 9/1997 | Palmer et al. | ............... | 360/106 |
| 5,708,541 A | 1/1998 | Erpelding | .................... | 360/104 |
| 5,781,380 A | 7/1998 | Berding et al. | .............. | 360/104 |
| 5,991,123 A | 11/1999 | Casey | ......................... | 360/104 |
| 6,166,888 A | 12/2000 | Tsuda et al. | .............. | 360/264.2 |
| 6,409,521 B1 * | 6/2002 | Rathburn | ..................... | 439/66 |
| 6,665,149 B2 | 12/2003 | Abe | ......................... | 360/264.2 |
| 6,741,778 B1 * | 5/2004 | Chan et al. | .................... | 385/52 |
| 6,836,003 B2 * | 12/2004 | Corisis et al. | ............... | 257/666 |
| 2002/0154482 A1 * | 10/2002 | Miyake et al. | .............. | 361/697 |
| 2003/0085474 A1 * | 5/2003 | Frankowsky et al. | ........ | 257/777 |

FOREIGN PATENT DOCUMENTS

| | | | | |
|---|---|---|---|---|
| DE | 19653132 A1 | * | 6/1997 | |
| GB | 2284713 A | * | 6/1995 | |
| JP | 01310594 A | * | 12/1989 | |
| JP | 06177310 A | * | 6/1994 | |
| JP | 2002368017 A | * | 12/2002 | |
| JP | 2003007411 A | * | 1/2003 | |
| KR | 2002039081 A | * | 5/2002 | |

* cited by examiner

Primary Examiner—William J Klimowicz
(74) Attorney, Agent, or Firm—Kenyon & Kenyon LLP

(57) ABSTRACT

A method and apparatus for electrically coupling a slider to a controller circuit are disclosed. In one embodiment, a preamplifier with an integrated electrical connector (I-connector) may be connected via an electrical trace to a slider and via a head stack assembly flexible circuit to a control circuit. The pre-amplifier may have two parallel series of spring probe claws, two parallel series of contact pegs, two slots, or a slot and a rotary cam.

4 Claims, 10 Drawing Sheets

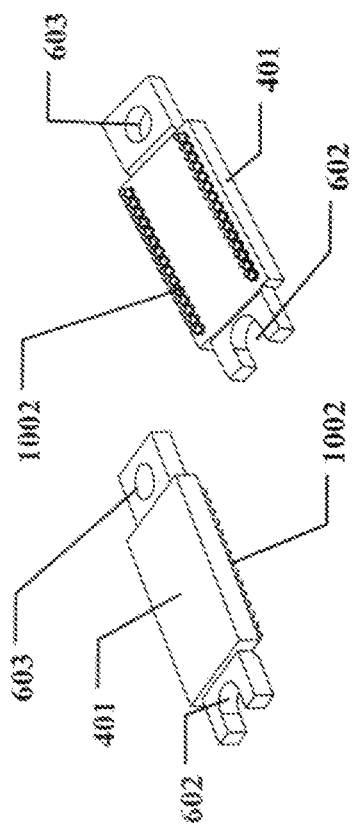
FIG. 10a
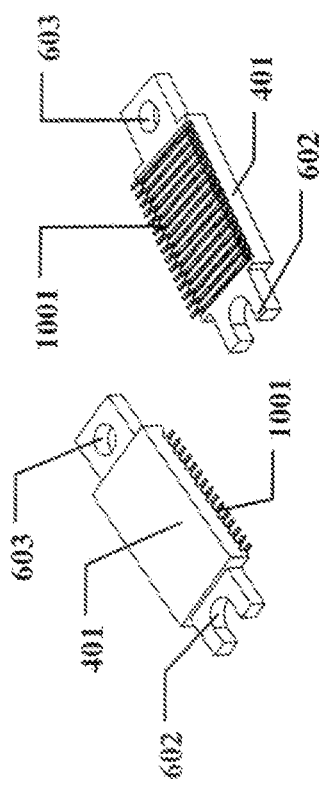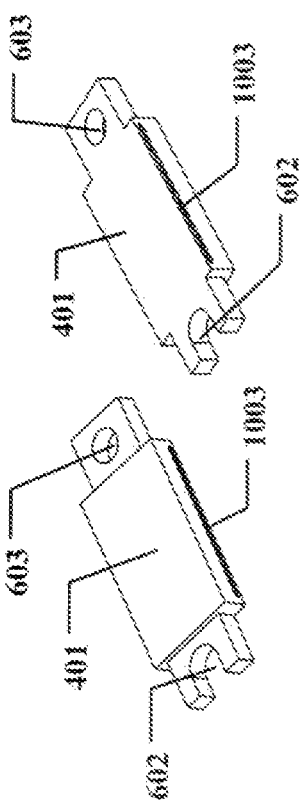
FIG. 10b
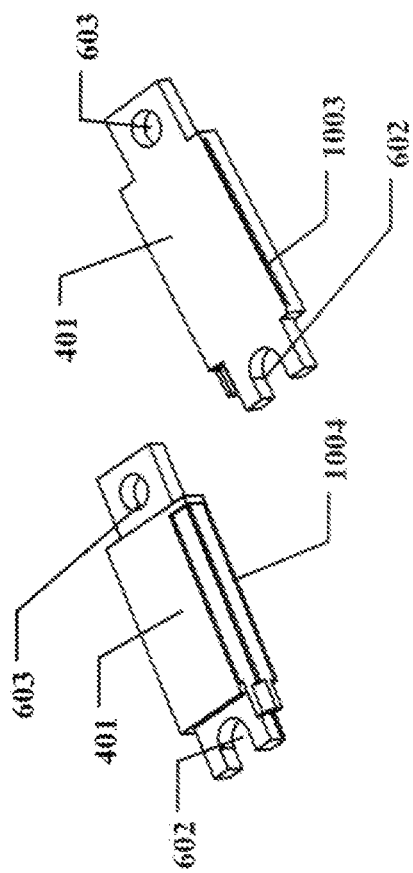
FIG. 10c
FIG. 10d

ELECTRICAL CONNECTION BETWEEN A SUSPENSION FLEXURE CABLE AND A HEAD STACK ASSEMBLY FLEXIBLE CIRCUIT

RELATED APPLICATIONS

This application is a Divisional of patent application Ser. No. 10/754,203, filed on Jan. 9, 2004 now U.S. Pat. No. 7,411,763 which claims the benefit of priority to Application No. PCT/CN03/00341, filed on 12 May 2003 (12.05.03).

BACKGROUND INFORMATION

The present invention relates to magnetic hard disk drives. More specifically, the present invention relates to a method of electrically connecting the actuator and micro-actuator to a control circuit.

In the art today, different methods are utilized to improve recording density in hard disk drives. FIG. 1 provides an illustration of a typical disk drive. The typical disk drive has a head gimbal assembly (HGA) configured to read from and write to a magnetic hard disk 101. The HGA and the magnetic hard disk 101 are mounted to the base 102 of a main board 103. The disk 101 is rotated relative to the base 102 by a spindle motor 104. The HGA typically includes an actuator arm 105 and a suspension 106. The HGA supports and positions a magnetic read/write slider 107 above the magnetic hard disk 101. The slider may contain transducers to perform the read/write function. The HGA is rotated relative to the base 102 along the axis of a pivot bearing assembly 108 by an actuator frame 109. The actuator frame 109 contains an actuator coil 110 driven by a magnet 111. A relay flexible printed circuit 112 connects a board unit 113 to the transducer of the magnetic read/write slider 107. The signal from the transducer is amplified by the preamplifier 114 before being transmitted along the relay flexible printed circuit.

FIG. 2 provides one illustration of an actuator as practiced in the prior art. The suspension 106, which supports the slider 107, may include a flexure 201 attached to a base plate 202 that suspends a load beam 203 coupled to the slider 107. The slider 107 may be electronically coupled by electrical traces 204 that run along the suspension 106 and actuator arm 105 to an actuator board 205. The actuator board 205 runs the signals from the slider 107 through a pre-amplifier 114 before sending them through the relay flexible printed circuit 112. The electrical traces 204 may be coupled to the actuator board 205 by a set of termination pads 206 at the end of the electrical traces 204.

FIG. 3 provides one illustration of the electrical connection between the slider 107 and the relay flexible printed circuit 112 as practiced in the prior art. The electrical trace 204 coupled to the suspension 106 may electrically connect the slider 107 to the termination pads 206. The termination pads 206 may be coupled to a set of contact pads 301 on the actuator board 205. The signal is then sent through a pre-amplifier to the relay flexible printed circuit 112.

In order to carry out previous methods of establishing an electrical connection, the flex cable on the suspension must be aligned properly to the pads of the actuator board 205. If soldering is used to connect the pads, the solder bump must be preliminarily formed on the pads for solder bonding. Laser or ultrasonic bonding can be prohibitively expensive and time consuming due to the necessary calibration work.

BRIEF DESCRIPTION OF THE DRAWINGS

FIGS. 10a-d provide an illustration of alternate embodiments of the pre-amplifier with I-connector.

DETAILED DESCRIPTION

A method and apparatus for electrically coupling a slider to a controller circuit are disclosed. In one embodiment, a pre-amplifier with an integrated electrical connector (I-connector) may be connected via an electrical trace to a slider and via a head stack assembly flexible circuit to a control circuit. The pre-amplifier may have two parallel series of spring probe claws, two parallel series of contact pegs, two slots, or a slot and a rotary cam.

Figure 1:
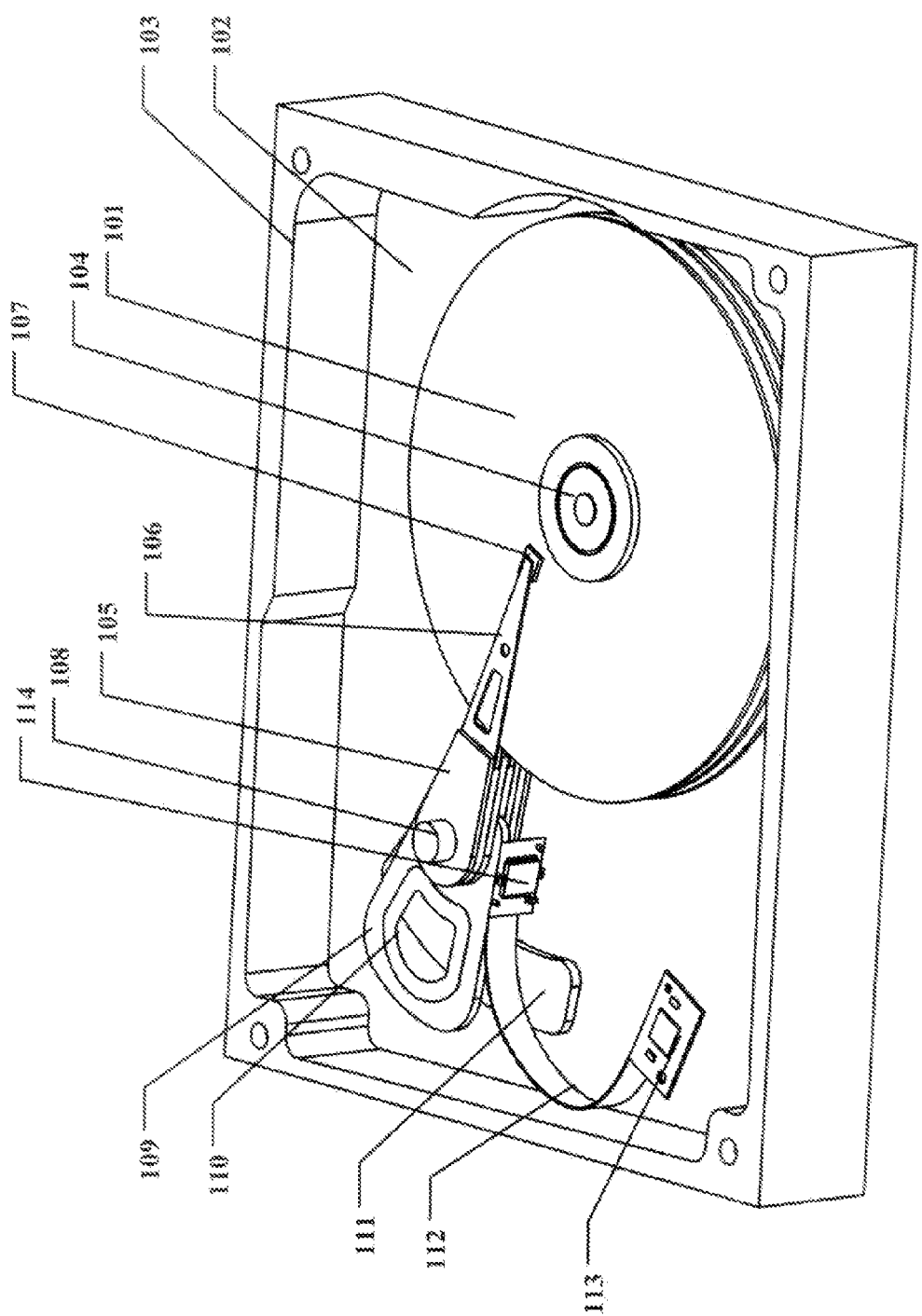
FIG. 1 provides an illustration of a typical disk drive.
Figure 2:
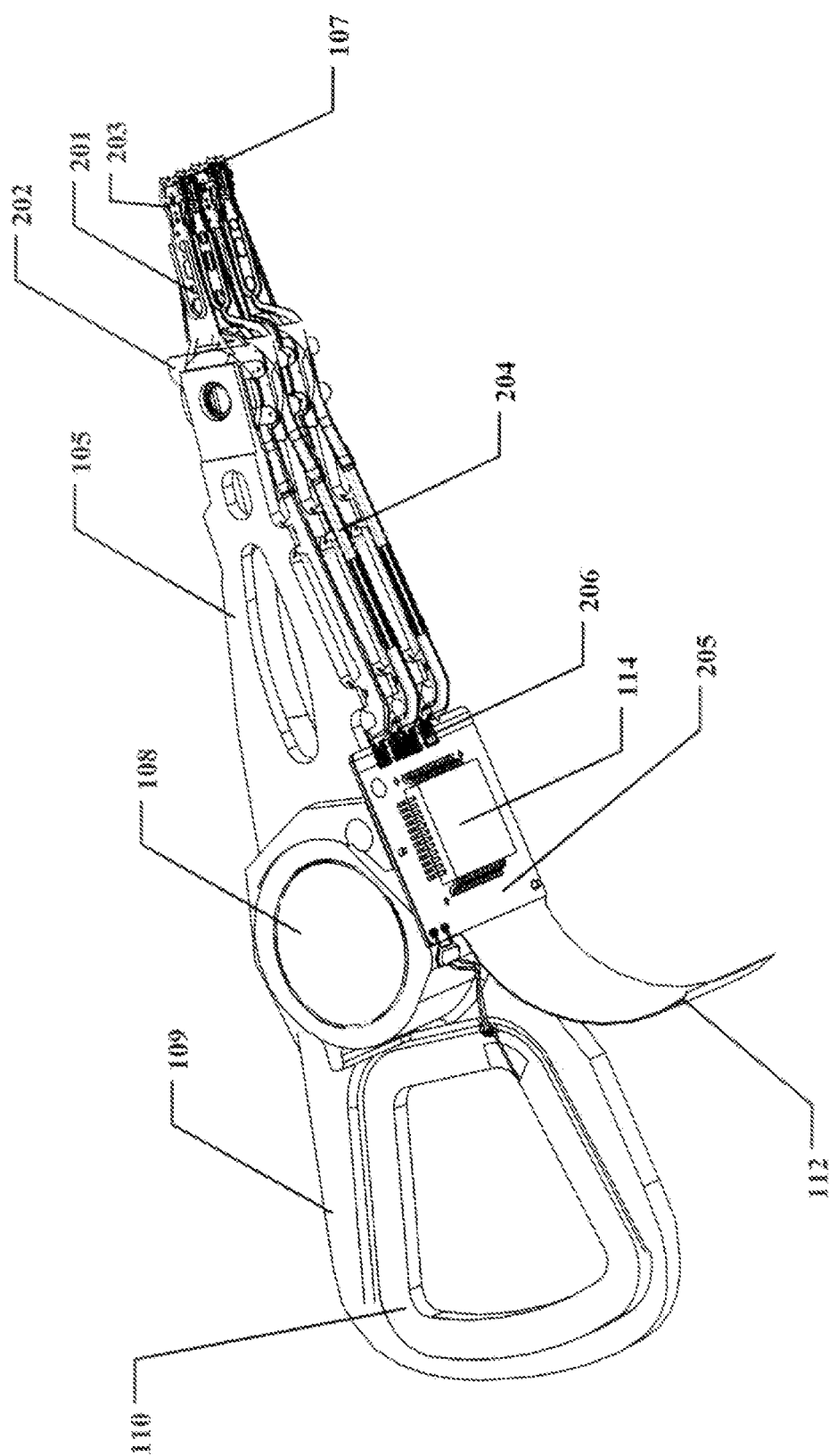
FIG. 2 provides one illustration of an actuator as practiced in the prior art.
Figure 3:
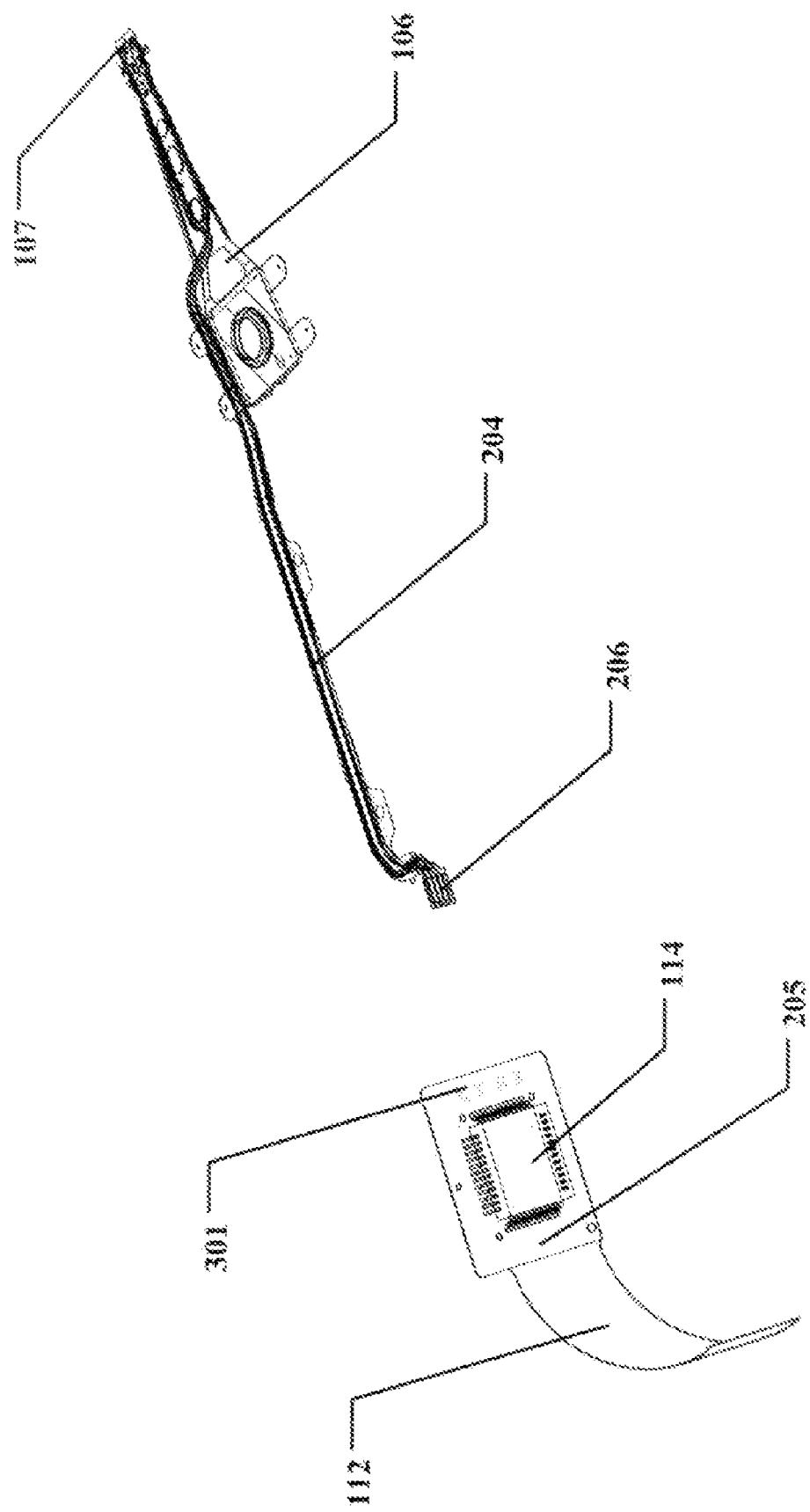
FIG. 3 provides one illustration of the electrical connection between the slider and the relay flexible printed circuit as practiced in the prior art.
Figure 4:
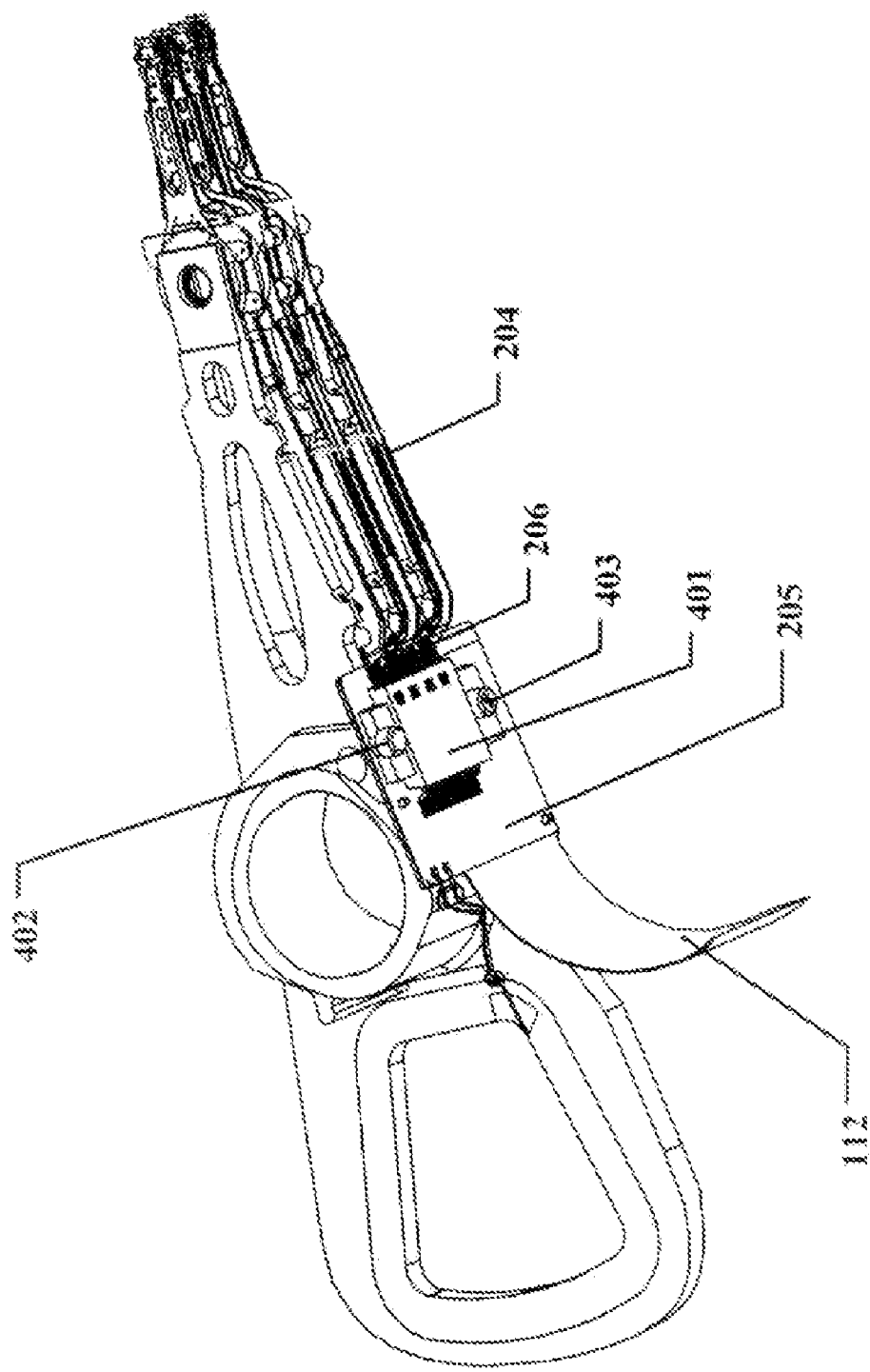
FIG. 4 provides an illustration of one embodiment of an actuator with an electrical connection as constructed in the present invention.

FIG. 4 illustrates one embodiment of an actuator with an electrical connection as constructed in the present invention. The pre-amplifier 401 of the actuator board 205 may have a built in I-connector. The termination pads 206 of the electrical traces 204 may be directly connected to the pre-amplifier with I-connector 401. An alignment pin 402 extending up from the actuator board 205 may allow the pre-amplifier with I-connector 401 to be position. A screw 403 or other coupling device may be used to couple the I-connector to the actuator board 205.

Figure 5:
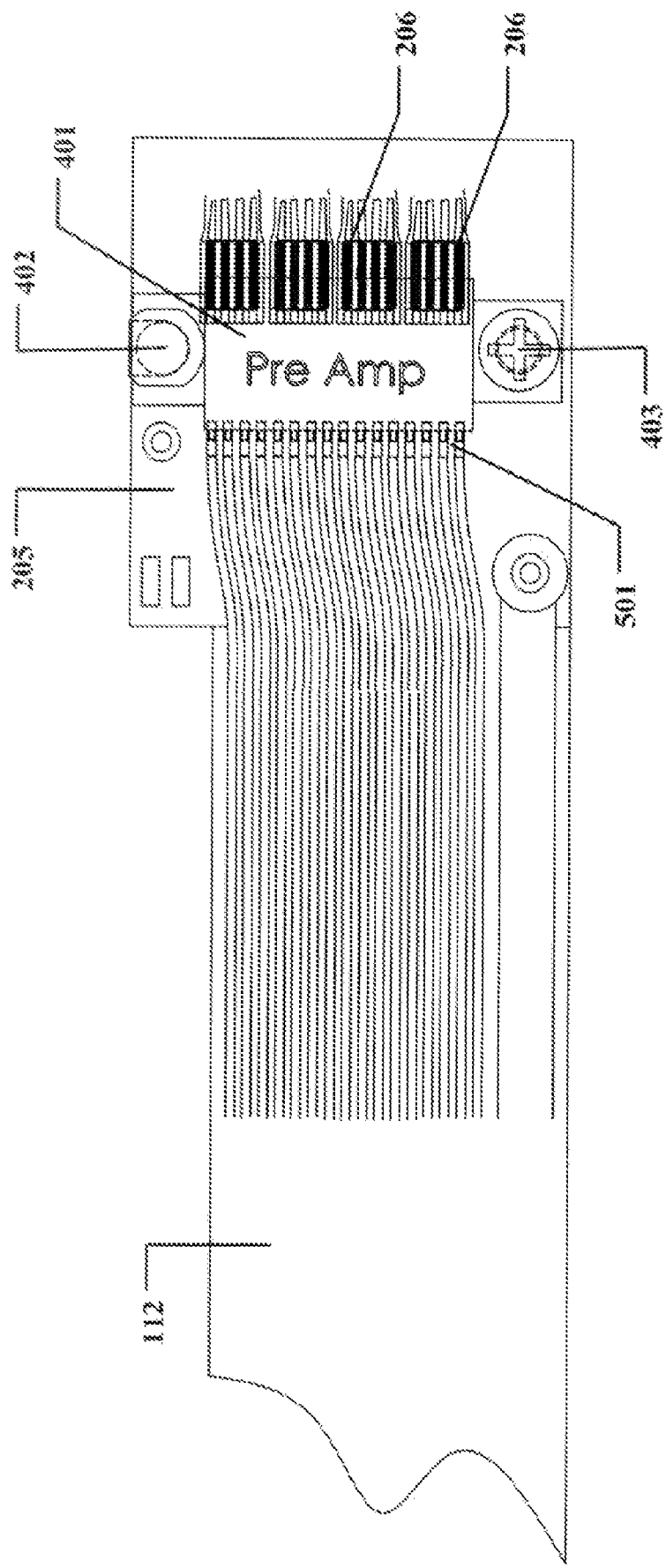
FIG. 5 provides an illustration of one embodiment of the electrical connection as constructed in the present invention.

FIG. 5 illustrates one embodiment of the electrical connection. The pre-amplifier with I-connector 401 may be coupled to an actuator board 205 by using an alignment pin 402 and a screw 403 or other coupling device. The termination pads 206 of the electrical traces 204 may be directly coupled to the pre-amplifier with I-connector 401. The head stack assembly flexible circuit 112 may be coupled to the pre-amplifier with I-connector 401 by a direct connection 501 or by terminating in a controller connection tab that connects to the pre-amplifier with I-connector.

Figure 6:
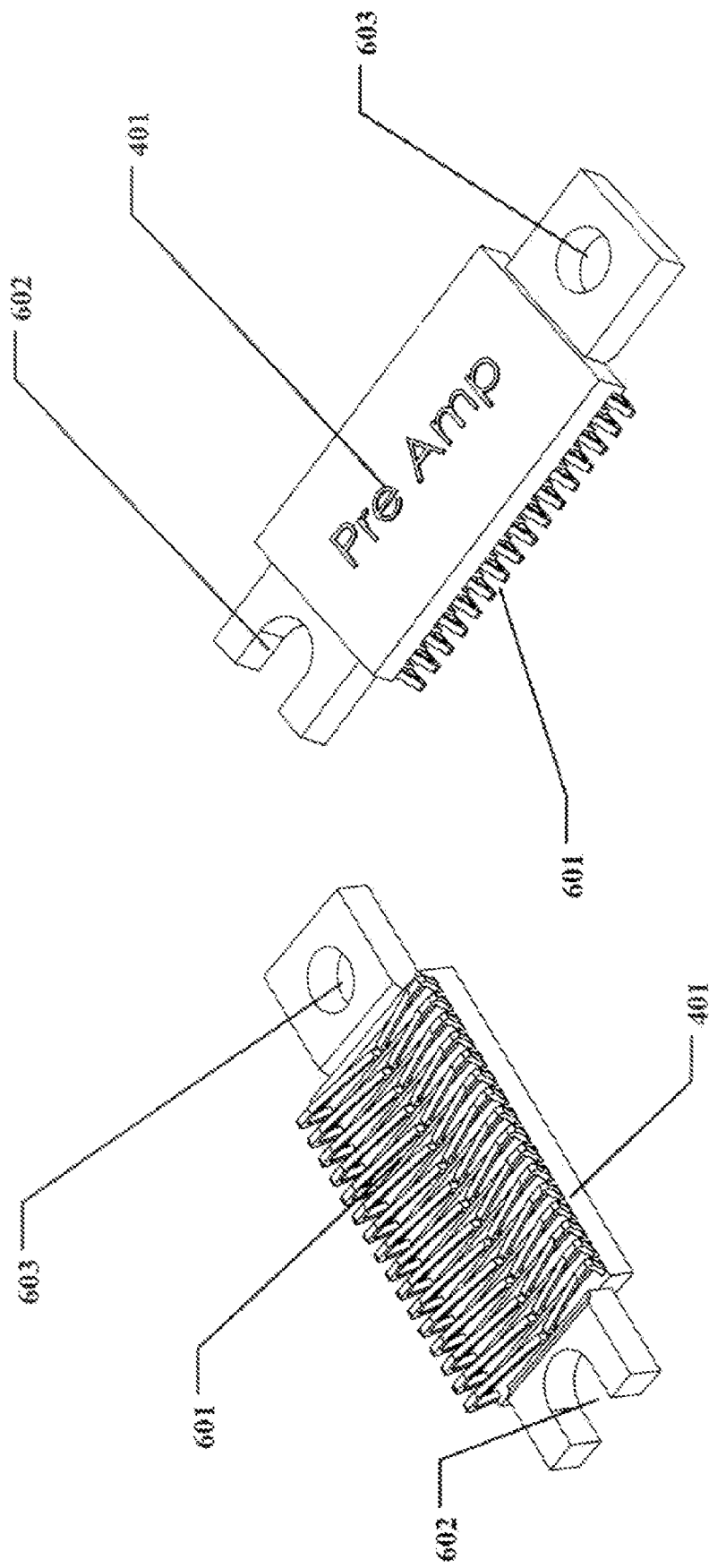
FIG. 6 provides an illustration one embodiment of a pre-amplifier with an I-connector.

FIG. 6 illustrates one embodiment of a pre-amplifier with an I-connector 401. Two parallel rows of spring probe claws 601 may line the bottom of the pre-amplifier with I-connector 401. The spring probe claws 601 may bend inwards towards the center of the pre-amplifier with I-connector 401. An alignment slot 602 may be used to align the pre-amplifier with I-connector 401 with the alignment pin 402. A screw hole 603 may allow the pre-amplifier with I-connector 401 to be coupled to the actuator board by a screw 403 or other coupling device.

Figure 7:
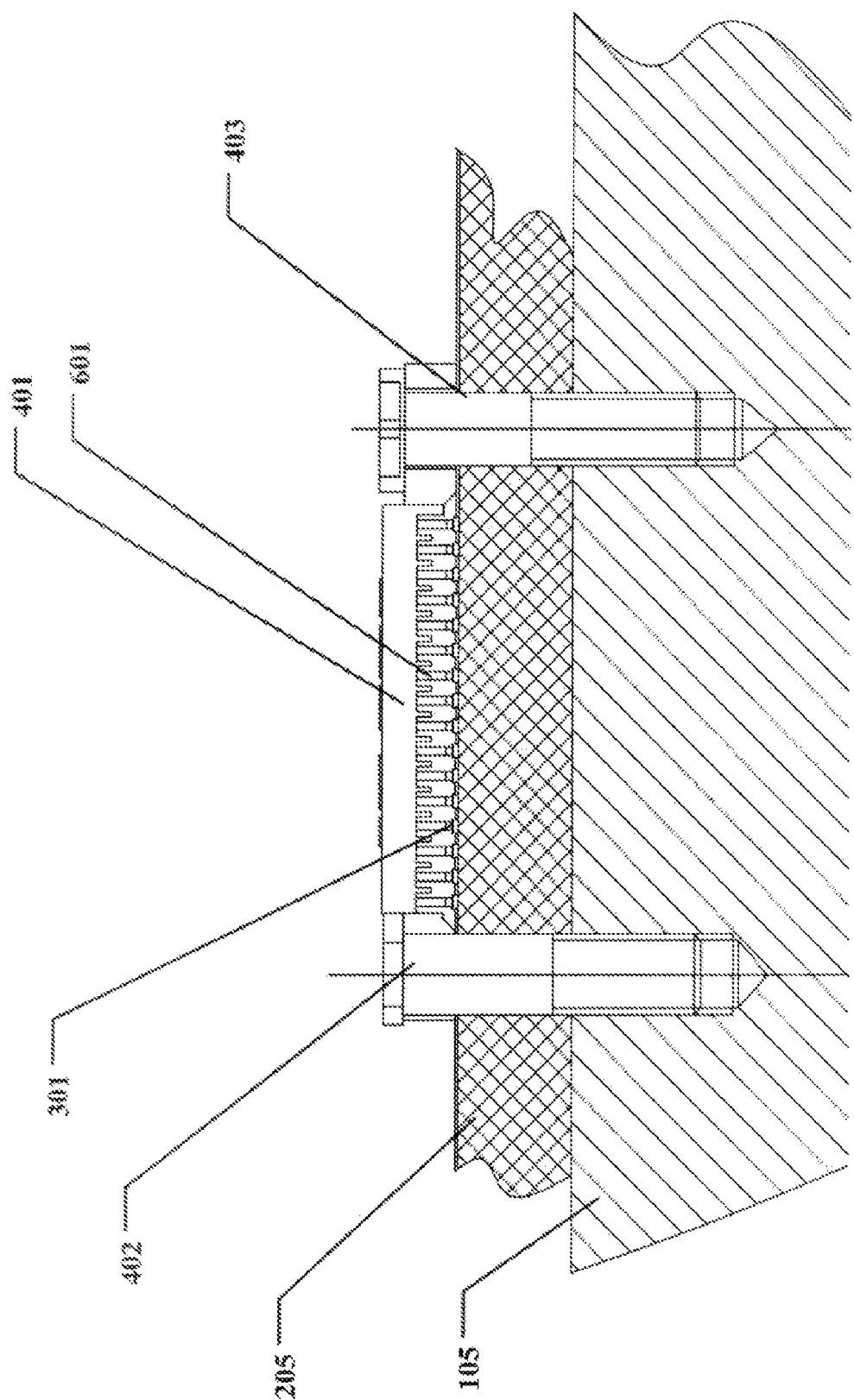
FIG. 7 provides an illustration in a cross-section one embodiment of the pre-amplifier with I-connector as used in creating an electrical connection.

FIG. 7 illustrates in a cross-section one embodiment of the pre-amplifier with I-connector 401 as used in creating an electrical connection. The pre-amplifier with I-connector 401 may be aligned to the actuator board 205 by an alignment pin extending up from the actuator arm 105 through the actuator board 205 and the alignment slot 602 of the pre-amplifier with I-connector 401. The pre-amplifier with I-connector 401 may then be coupled to the actuator board 205 and arm 105 by a screw 403 or other coupling device. The screw 403 or other coupling device may cause the spring probe claws 601 to be in contact with the contact pads 301 of the actuator board 205. The contact pads 301 may be electrically coupled to the head stack assembly flexible circuit 112.

Figure 8:
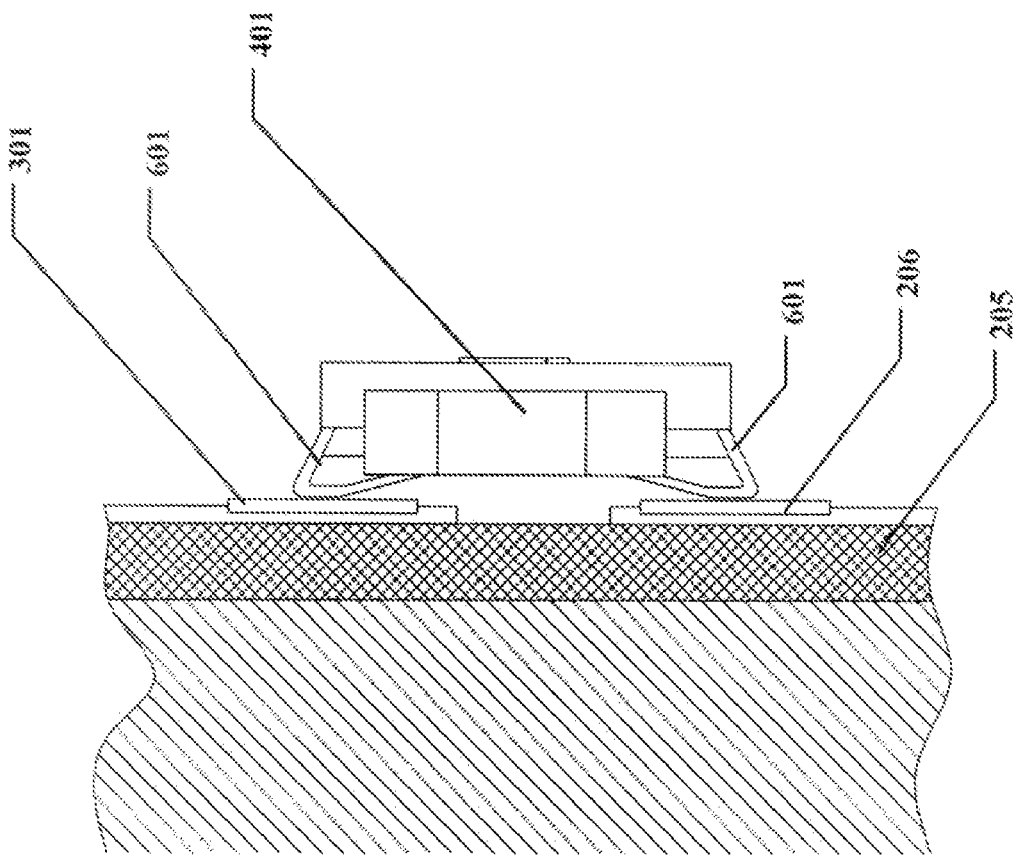
FIG. 8 provides an illustration in a side view of one embodiment of the electrical connection.

FIG. 8 illustrates in a side view one embodiment of the electrical connection. One series of spring probe claws 601 may be in contact with the contact pads 301 of the actuator board 205. The other series of spring probe claws 601 may be in contact with the termination pads 206 of the electrical traces 204. The termination pads 206 may be affixed to the actuator board 205 by adhesive or other coupling methods. Alternatively, the termination pads 206 may be held in place by the pressure generated by coupling the pre-amplifier with I-connector 401 to the actuator board 205.

Figure 9:
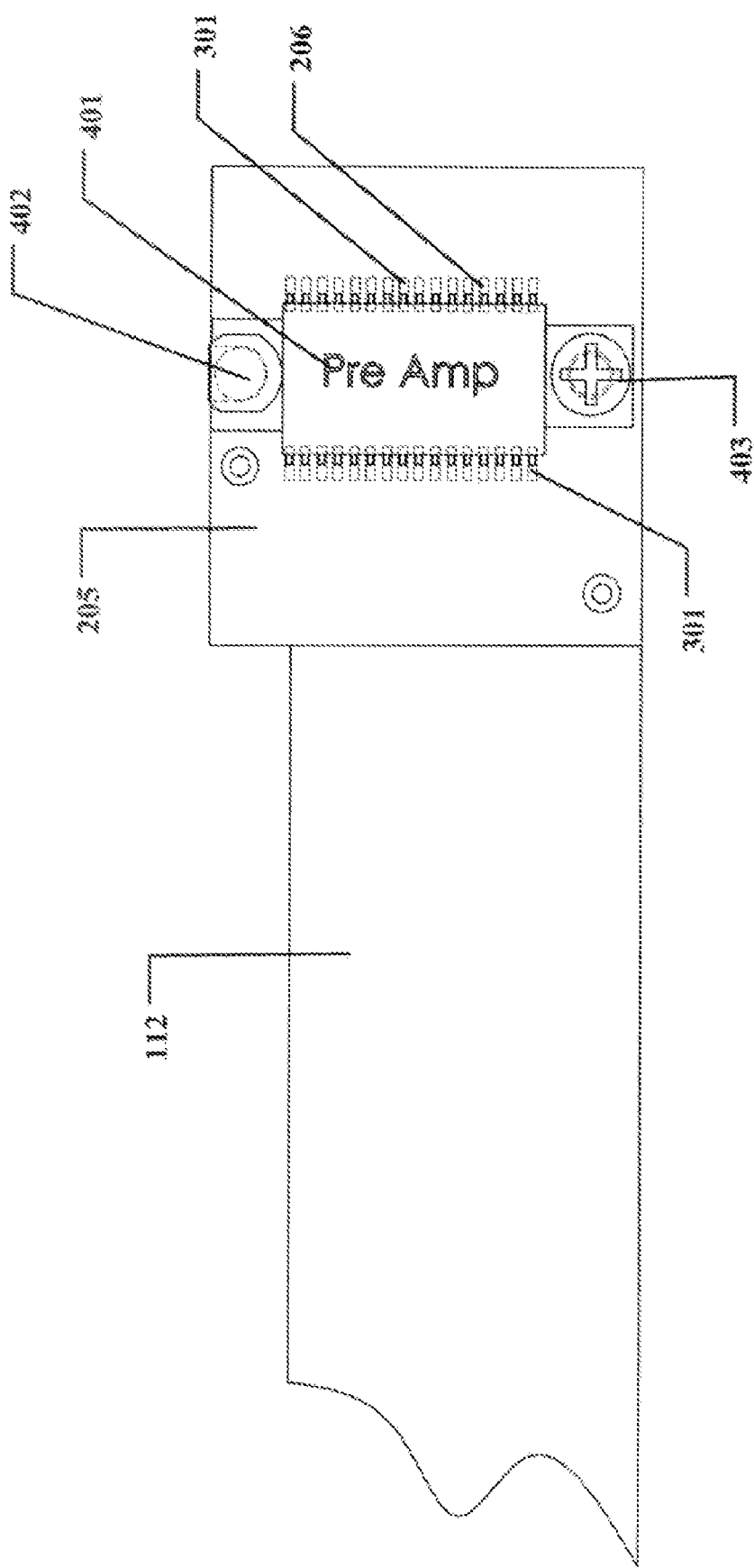
FIG. 9 provides an illustration in a top view of one embodiment of the electrical connection.

FIG. 9 illustrates in a top view the same embodiment of the electrical connection. The alignment pin 402 may keep the spring probe claws 601 aligned with the termination pads 206 and the contact pads 301. The screw 403 or other coupling device may be adjusted to create the proper amount of pressure to keep the termination pads 206 in contact with the spring probe claws 601.

FIGS. 10*a-d* illustrate alternate embodiments of the pre-amplifier with I-connector 401. FIG. 10*a* shows an embodiment of the pre-amplifier with I-connector 401 with spring probe claws 1001 that bend toward the outside of the pre-amplifier with I-connector 401. FIG. 10*b* shows an embodiment of the pre-amplifier with I-connector 401 with two parallel series of contact pegs 1002 instead of two series of spring probe claws 601. FIG. 10*c* shows an embodiment of the pre-amplifier with I-connector 401 with a slot 1003 on each side. The head stack assembly flexible circuit 112 may be inserted into one of the slots 1003 and the electrical trace 204 may be inserted into the other slot. FIG. 10*d* shows an embodiment of the pre-amplifier with I-connector 401 with a slot 1003 on one side and a rotary cam 1004 on the other side.

The head stack assembly flexible circuit 112 may be inserted into the slot 1003. The termination pads 206 of the electrical traces 204 are coupled to the rotary cam 1004.

Although several embodiments are specifically illustrated and described herein, it will be appreciated that modifications and variations of the present invention are covered by the above teachings and within the purview of the appended claims without departing from the spirit and intended scope of the invention.

The invention claimed is:

1. A method, comprising:
    electrically coupling at least one electrical trace termination pad to a slider;
    electrically coupling a head stack assembly flexible circuit to a control circuit;
    electrically coupling the at least one electrical trace termination pad to the head stack assembly flexible circuit with a pre-amplifier with an integrated connector;
    coupling the pre-amplifier to an actuator circuit board mounted on an actuator arm
    pressure coupling the pre-amplifier to the at least one electrical trace termination pad using at least one slider spring probe claw protruding from the pre-amplifier; and
    pressure coupling the pre-amplifier to at least one electrical actuator controller connection tab of the head stack assembly flexible circuit using at least one controller spring probe claw protruding from the pre-amplifier.

2. The method of claim 1, further comprising coupling the pre-amplifier to the actuator circuit board by a fastener.

3. The method of claim 1, wherein the at least one slider spring probe claw and the at least one controller spring probe claw curve inward.

4. The method of claim 1, wherein the at least one slider spring probe claw and the at least one controller spring probe claw extend outward.

* * * * *